United States Patent
Hsu et al.

(10) Patent No.: US 6,922,363 B2
(45) Date of Patent: Jul. 26, 2005

(54) METHOD FOR OPERATING A NOR-ARRAY MEMORY MODULE COMPOSED OF P-TYPE MEMORY CELLS

(75) Inventors: Ching-Hsiang Hsu, Hsin-Chu (TW); Shih-Jye Shen, Hsin-Chu (TW); Hsin-Ming Chen, Tainan Hsien (TW); Hai-Ming Lee, Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 57 days.

(21) Appl. No.: 10/707,564

(22) Filed: Dec. 22, 2003

(65) Prior Publication Data

US 2005/0030793 A1 Feb. 10, 2005

Related U.S. Application Data

(60) Provisional application No. 60/491,964, filed on Aug. 4, 2003.

(51) Int. Cl.[7] ............................................. G11C 16/04
(52) U.S. Cl. ............................ 365/185.29; 365/185.28; 365/185.27
(58) Field of Search ....................... 365/185.29, 185.28, 365/185.27, 185.18, 185.33

(56) References Cited

U.S. PATENT DOCUMENTS 6,657,898 B2 * 12/2003 Hirano .................. 365/185.29

* cited by examiner

Primary Examiner—David Lam
(74) Attorney, Agent, or Firm—Winston Hsu

(57) ABSTRACT

A method for writing a memory module includes providing a plurality of memory cells. Each memory cell includes a substrate, a P-type drain and source, a gate, and a stack dielectric layer which stores 2-bit data. Memory cells are arranged in a matrix with gates and sources on the same row connected respectively to the same word line and same source line, and drains on the same column connected to the same bit line. Each line receives a respective voltage with the word line of the memory cell to be written receiving voltage to turn on its P-type channel, the word line of the memory cell not to be written receiving voltage to turn off its P-type channel, and the bit line of the memory cell to be written receiving voltage so that a hot hole in its P-type channel induces hot electron injection into its stack dielectric layer.

20 Claims, 9 Drawing Sheets

| Voltage | Write | Read | Erase |
|---|---|---|---|
| $V_G$ | -2 | 0 | -6 |
| $V_S$ | 0 | -1.8 | 6 |
| $V_D$ | -6 | 0 | FL |
| $V_{NW}$ | 0 | 0 | 6 |
| SL | 0 | -1.8 | 6 |
| WL1 | 1 | 2 | 0 |
| WL2 | -2 | 0 | -6 |
| WL3 | 1 | 2 | 0 |
| WL4 | 1 | 2 | 0 |
| BL1 | FL | FL | FL |
| BL2 | -6 | 0 | FL |
| BL3 | FL | FL | FL |

Fig. 9

METHOD FOR OPERATING A NOR-ARRAY MEMORY MODULE COMPOSED OF P-TYPE MEMORY CELLS

This application claims benefit of 60/491,964 filed on Aug. 4, 2003.

BACKGROUND OF INVENTION

1. Field of the Invention

The present invention relates to a method for operating a memory module, and more specifically, to a method for operating a NOR-array memory module composed of P-type memory cells.

2. Description of the Prior Art

Flash memory can be divided into P-channel flash memory and N-channel flash memory according to the type memory cells used. Memory cells of an N-channel flash memory are formed on a P-type substrate with two N-type doped regions respectively used as a source and a drain of each memory cell. Memory cells of a P-channel flash memory are formed on an N-type well with two P-type doped regions respectively used as a source and a drain of each memory cell. Generally speaking, memory cells of an N-channel flash memory have a faster operational speed than memory cells of a P-channel flash memory. However, memory cells of an N-channel flash memory require higher voltage and power while memory cells of a P-channel flash memory operate with lower voltage and power.

Alternatively, flash memory can be divided according to structure into NOR flash memory and NAND flash memory. The drains of memory cells of a NOR flash memory are connected in parallel for a faster reading speed, which is suitable for code flash memory mainly used for executing program code. The drains and sources of two neighboring memory cells of a NAND flash memory are serially connected for integrating more memory cells per unit area, which is suitable for a data flash memory mainly used for data storage. NAND flash memory and NOR flash memory have different operating methods. Typically, NAND flash memory composed of N-channel memory cells utilizes Fowler-Nordheim (FN) tunneling during writing operations, while a NOR flash memory composed of N-channel memory cells utilizes channel hot electron injection during writing operations.

In 1992, in their paper "A High Speed, Low Power P-Channel Flash EEPROM Using Silicon Rich Oxide as Tunneling Dielectric" in International Conference on Solid State Devices and Materials (SSDM), p. 140-p. 142, Hsu et al. disclosed that the hot electron injection current in a P-channel memory can be larger by two orders of magnitude than that in an N-channel memory, and the channel current in a P-channel memory can be less by two orders of magnitude than that in an N-channel memory.

In 1995, T. Ohnakado et al. of Mitsubushi Co. disclosed a technology using a gate induced drain leakage (GIDL) current accelerated by a lateral electric field to generate hot electrons, which has been applied in the writing operation of a P-channel flash memory, in their paper "Novel Electron Injection Method Using Band-to-Band Tunneling Induced Hot Electron (BBHE) for Flash Memory with a P-Channel Cell".

As mentioned above, although N-channel flash memory has a faster operating speed than P-channel flash memory, P-channel flash memory can operate under lower voltage and power, which is more suitable than N-channel flash memory for portable electronic products requiring lower power consumption. As technology progresses, the operational methods of P-channel flash memory are continuously being renewed. However in practical applications, both NAND flash memory composed of P-channel memory cells and NOR flash memory composed of P-channel memory cells require better operating methods for better performance.

SUMMARY OF INVENTION

It is therefore a primary objective of the present invention to provide a method for operating a NOR-array memory module composed of P-type memory cells.

Briefly summarized, the present invention provides a method for writing a memory module including providing a plurality of memory cells, wherein each memory cell stores 2-bit data and comprises a substrate, a P-type drain, a P-type source, a stack dielectric layer, and a gate, with the plurality of memory cells being arranged in a matrix with the gates of the memory cells on the same row being connected to the same word line, the drains of the memory cells on the same column being connected to the same bit line, the sources of the plurality of memory cells being connected to the same source line.

The method for writing a memory module further includes applying a source line voltage to the source lines of the plurality of memory cells, applying a first word line voltage to the word line of the memory cell to be written in order to turn on a P-type channel of the memory cell to be written, applying a second word line voltage to the word line of the memory cell not to be written in order to turn off the P-type channel of the memory cell, applying a bit line voltage to the bit line of the memory cell to be written so that a hot hole in the P-type channel of the memory cell to be written induces hot electrons to be injected into the stack dielectric layer of the memory cell to be written, and applying a substrate voltage to the substrate of the plurality of memory cells.

The present invention further provides a method for reading a memory module. The method includes applying a source line voltage to the source lines of the plurality of memory cells, applying a first word line voltage to the word line of the memory cell to be read, applying a second word line voltage larger than the first word line voltage to the word line of the memory cell not to be read, applying a voltage equivalent to the first word line voltage to the substrates of the plurality of memory cells, and applying a bit line voltage to the bit line connected to the memory cell to be read in order to enlarge a depletion region between the P-type drain or the P-type source and the substrate of the memory cell to be read.

The present invention further provides a method for erasing a memory module including applying a word line voltage to the word lines of the plurality of memory cells, applying a source line voltage larger than the word line voltage to the source lines of the plurality of memory cells, and applying a voltage equivalent to the source line voltage to the substrates of the plurality of memory cells.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 9 is a voltage list of the present invention.

DETAILED DESCRIPTION

Figure 1:
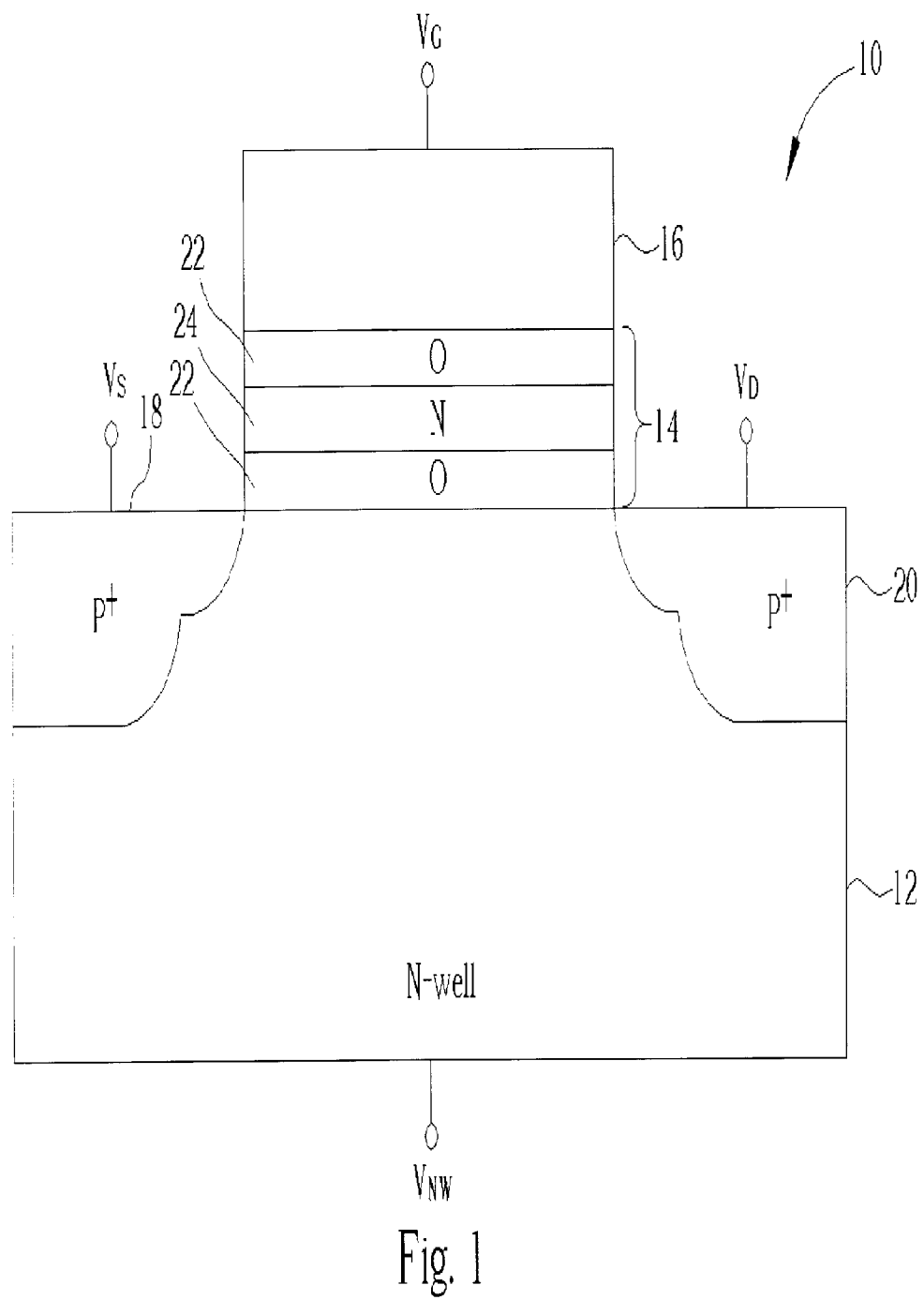
FIG. 1 is a cross-sectional view of a P-type memory cell according to the present invention.
Figure 2:
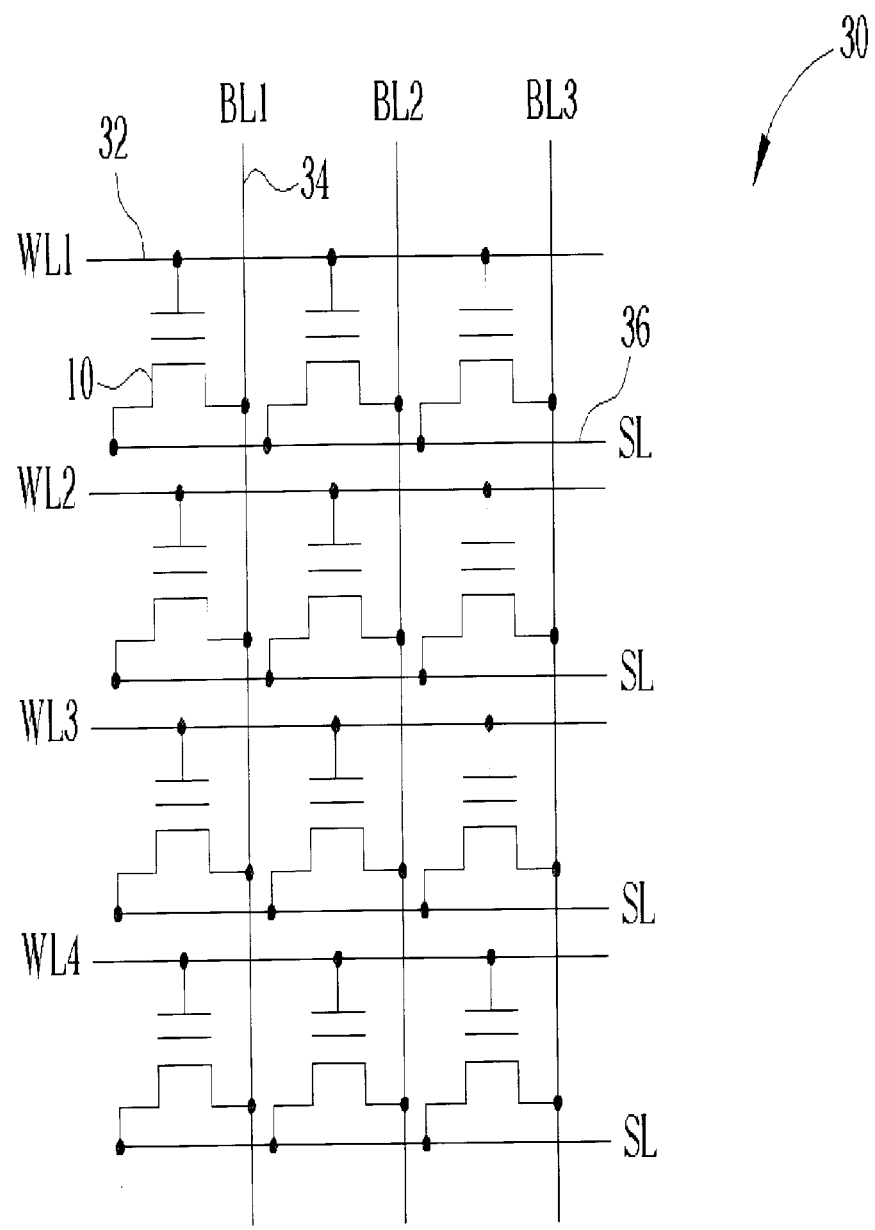
FIG. 2 illustrates a memory module according to the present invention.

Please refer to FIG. 1 showing a cross-sectional view of a P-type memory cell 10, and to FIG. 2 showing a memory module 30 according to the present invention. As shown in FIG. 1, the P-type memory cell 10 includes an N-type well 12, a stack dielectric layer 14 formed on the N-type well 12, a gate 16 formed on the stack dielectric layer 14, a P-type source 18 formed on the N-type well 12 on one side of the stack dielectric layer 14, and a P-type drain 20 formed on the N-type well 12 on the other side of the stack dielectric layer 14.

In the preferred embodiment of the present invention, the N-type well 12 is formed on a P-type semiconductor substrate, and the gate 16 can be a polysilicon layer, a policide layer, or a metal layer. The stack dielectric layer 14 includes a lower silicon dioxide layer 22, a charge storage layer 24 and an upper silicon dioxide layer 22, wherein the charge storage layer can be composed of either silicon nitride ($Si_3N_4$) or silicon oxy-nitride ($Si_xN_yO_z$); therefore the stack dielectric layer 14 can also be called an oxide-nitride-oxide (ONO) layer. After electrons are injected into the charge storage layer 24, they are trapped and no longer migrate. Utilizing this characteristic, the P-type memory cell 10 can store 2-bit data by injecting electrons into a position neighboring the drain 20 and the source 18.

As shown in FIG. 2, the memory module 30 includes a plurality of P-type memory cells 10 arranged in a matrix. The gates of the memory cells 10 on the same row are connected to the same word line 32, the drains of the memory cells 10 on the same column are connected to the same bit line 34, and the sources of the memory cells 10 on the same row are connected to the same source line 36. Such kind of a memory array architecture is called a NOR-array. Since the drains of the memory cells on the same column are connected in parallel to each other, and a voltage is directly input by the bit line when writing, the NOR-array can operate rapidly, making it suitable for storing program code.

Figure 3:
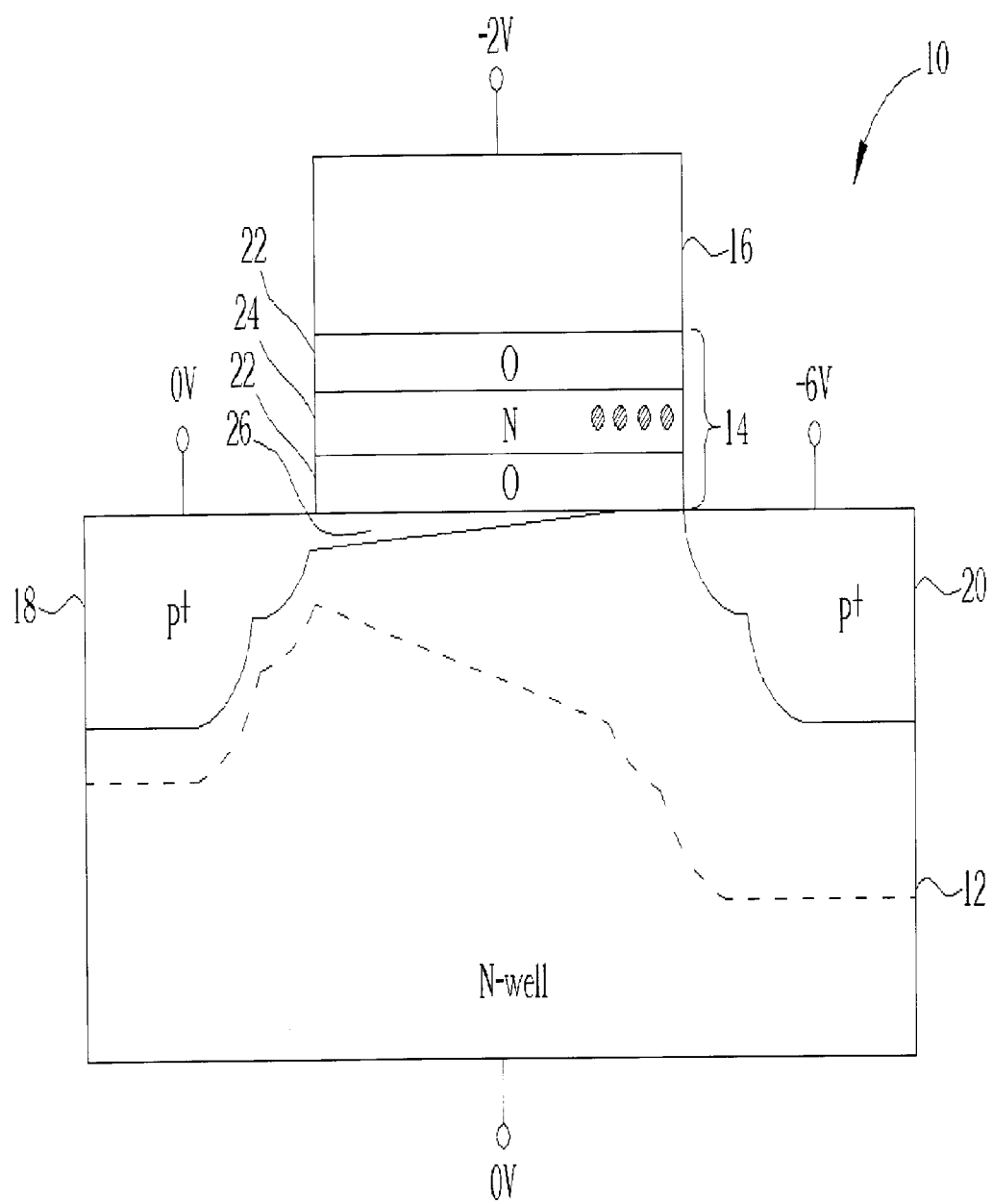
FIG. 3 illustrates the write operation of a P-type memory cell according to the present invention.
Figure 4:
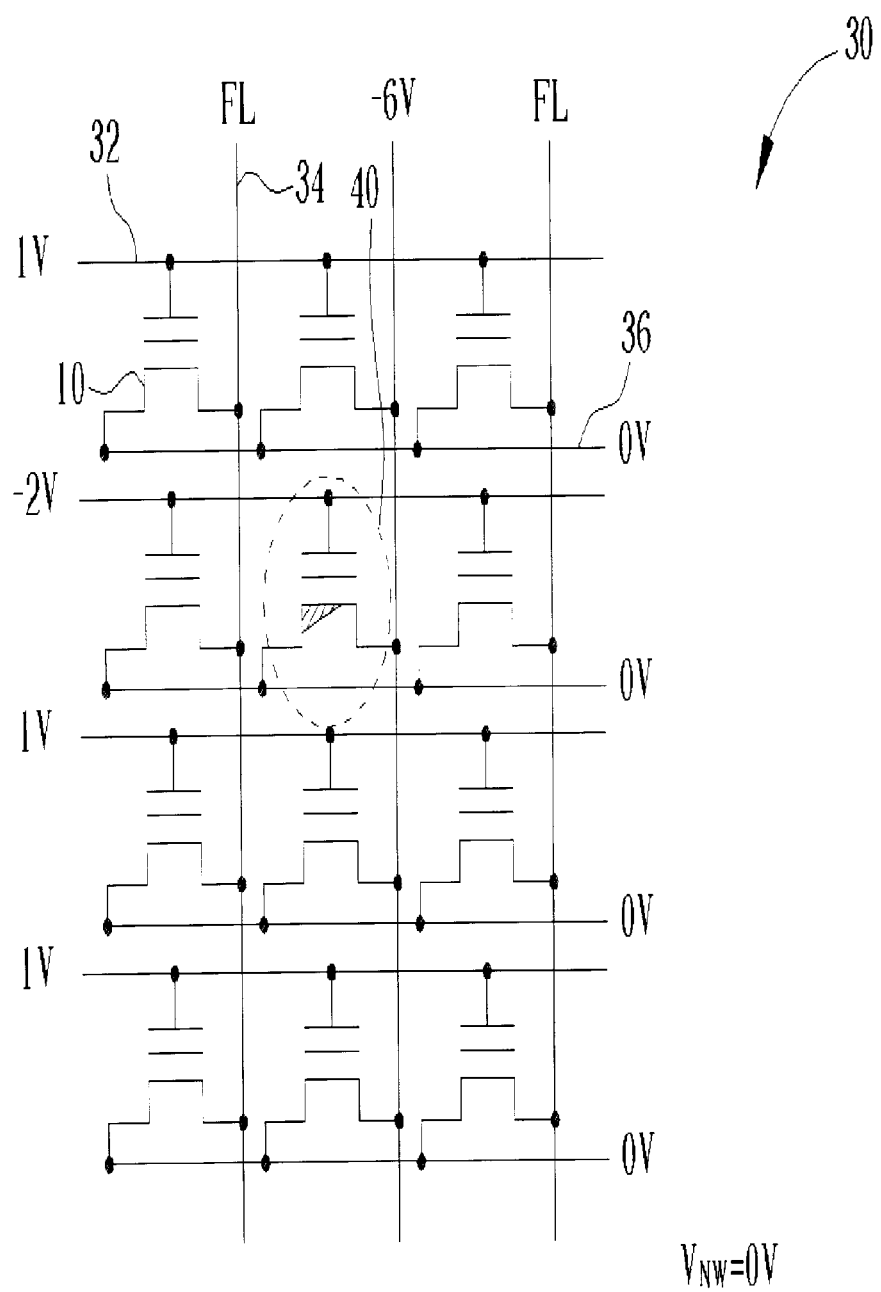
FIG. 4 illustrates the write operation of the memory module according to the present invention.

Please refer to FIG. 3 showing the write operation of the P-type memory cell 10, and FIG. 4 showing the write operation of the memory module 30; both of which are according to the present invention. The writing operation of the P-type memory cell 10 involves injecting electrons into the charge storage layer 24 of the memory cell 10 by applying channel hot hole induced hot electron injection. As shown in FIG. 3, in the case of injecting electrons into a position adjacent to the drain 20 of the P-type memory cell 10, a voltage of 0V is applied to the N-type well 12 of the P-type memory cell 10, a voltage of −2V is applied to the gate 16 to turn on a P-type channel 26 of the P-type memory cell 10, a voltage of 0V is applied to the source 18, and a voltage of −6V is applied to the drain 20. In the mean time, while the P-type memory cell 10 operates in saturation region, the hole in the P-type channel 26 is accelerated by an electric field causing it to collide with the N-type well 12 and generate an electron-hole pair. Some electrons generated by the collision are accelerated by the electric field, attracted by the gate voltage and then inject into the charge storage layer 24. This completes the right-bit data writing of the P-type memory cell 10. In case of the left-bit data writing of the P-type memory cell 10, that is, the electrons are injected into the charge storage layer 24 at a position adjacent to the source 18, the voltages applied to the source 18 and the drain 20 need only to be interchanged. In this case, the voltage applied to the source 18 is 6V, the voltage applied to the drain 20 is 0V, and the voltages applied to the gate 16 and the N-type well 12 remain the same.

The writing operation of the memory module 30 is the same as that of the single memory cell 10. To write the right-bit of a memory cell to be written 40 of the memory module 30, the bias condition is shown in FIG. 4. Please notice that with the exception of the word line (WL2) which is connected to the [memory cell to be written] 40 and subjected to a gate voltage of 2V, the other word lines (WL1, WL3, WL4) are all subjected to a voltage of 1V in order to turn off the P-type channel of the other memory cells. Doing so prevents the memory cells not to be written from being disturbed by the write operation of the [memory cell to be written] 40. In addition, the bit lines (BL1, BL3) that are not connected to the [memory cell to be written] 40 are only required to be floated (FL). In the present invention, the NOR-array utilizes channel hot hole induced hot electron injection so that the memory cell can be written under a low voltage, and the write interference between the memory cells can be reduced.

Figure 5:
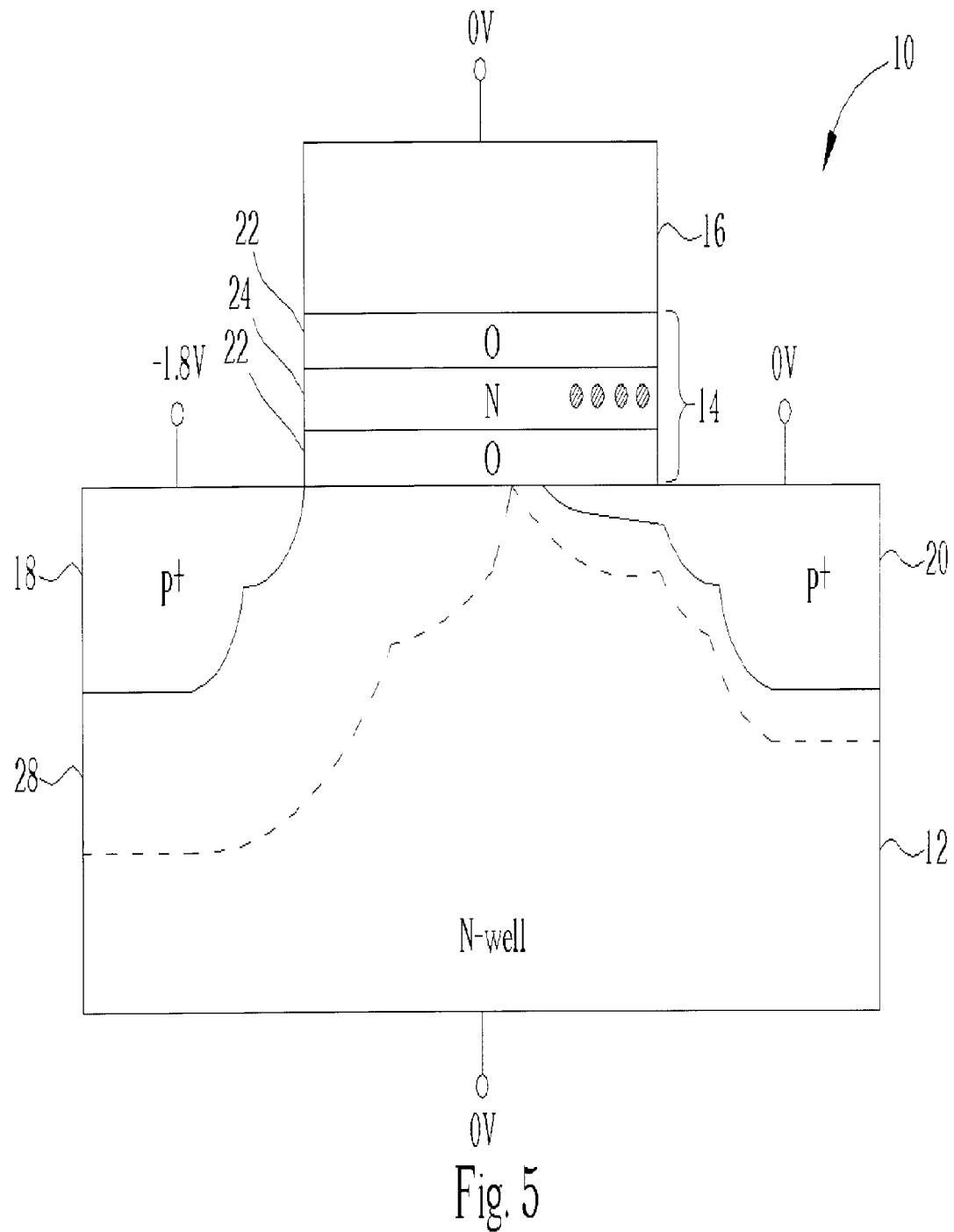
FIG. 5 illustrates the read operation of the P-type memory cell according to the present invention.
Figure 6:
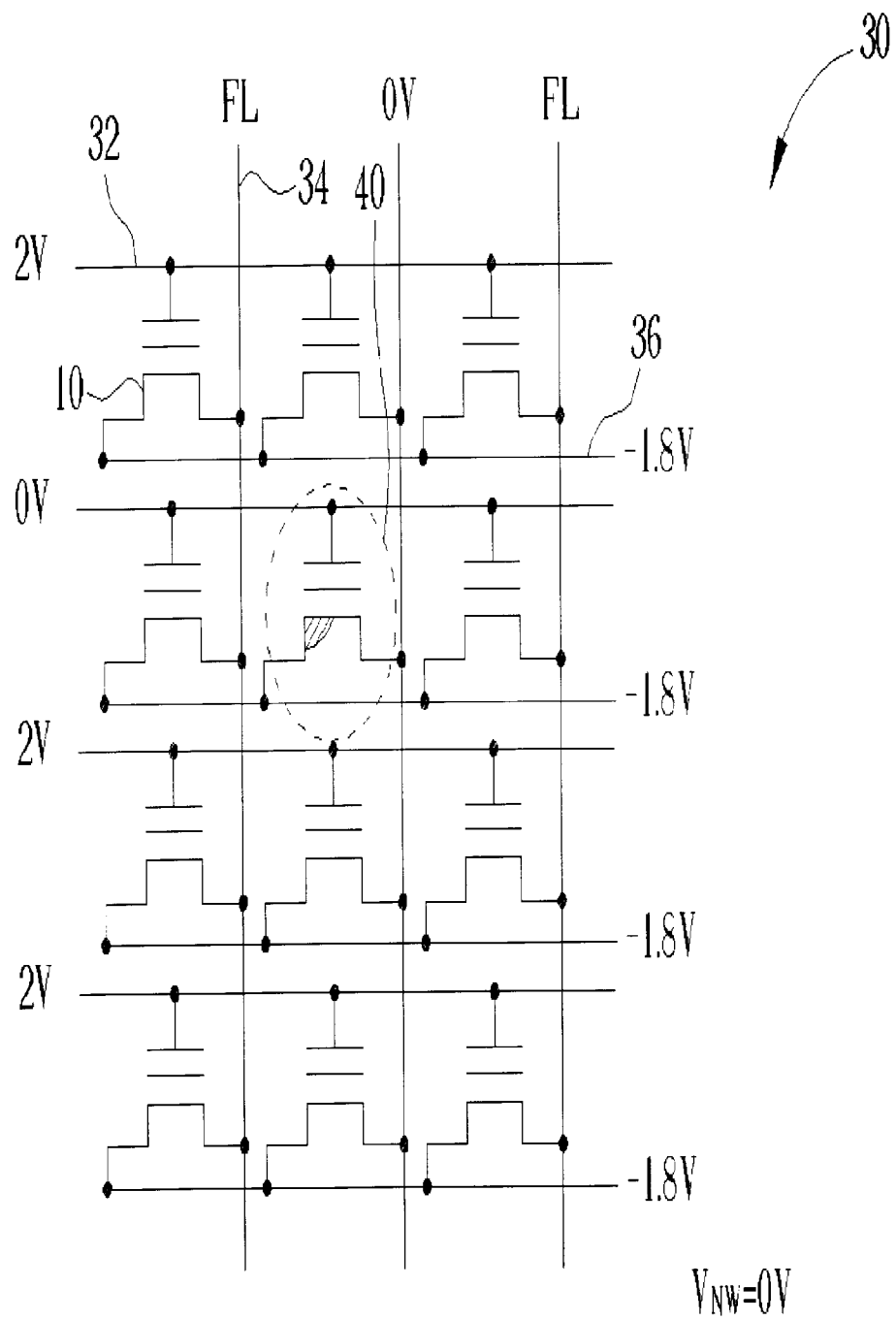
FIG. 6 illustrates the read operation of the memory module according to the present invention.

Please refer to FIG. 5 showing the read operation of the P-type memory cell 10, and to FIG. 6 showing the read operation of the memory module 30; both of which are according to the present invention. As shown in FIG. 5, when electrons are limited in the charge storage layer 24 adjacent to the drain 20, the electrons induce an inversion layer connected to the drain 20 causing it to extend toward the source 18 so that the channel is shortened. Therefore, to read the right-bit data of the P-type memory cell 10, a voltage of 1.8V is applied to the source 18 of the P-type memory cell 10 while a voltage of 0V is applied to the N-type well 12, the gate 16, and the drain 20 of the P-type memory cell 10. This will enlarge a depletion region 28 between the source 18 and the N-type well 12. While punch through occurs between the drain 20 and the source 18, a large conduction current flows through the memory cell. As a result, the value of the right-bit data of the memory cell can be read as 1. Additionally, to read the left-bit data of the P-type memory cell 10, a voltage of 1.8V is applied to the drain 20 and a voltage of 0V is applied to the N-type well 12, the gate 16, and the source 18 of the P-type memory cell 10. Whether the stored data are 1 or 0 can be determined by sensing the value of the current flowing through the P-type memory cell 10. Such kind of operation is called reverse read operation.

The read operation of the memory module 30 is shown in FIG. 6, which involves selecting a memory cell to be read 40 and then applying the voltages for the N-type well 12, the gate 16, the source 18, and the drain 20 to the N-type well 12, the word line 32 (WL2), the source line 36 (SL), and the bit line (BL2) respectively. Please notice that when reading the right-bit data of the [memory cell to be read] 40, a voltage of 1.8V is applied to the source line 36 (SL), and when reading the left-bit data of the [memory cell to be read] 40, a voltage of 1.8V is applied to the bit line (BL2). In addition, with the exception of the word line (WL2) connected to the [memory cell to be read] 40 which is subjected to a voltage same as that applied to the N-type well 12, the other word lines (WL1, WL3, WL4) are all subjected to a voltage of 2V in order to turn off the P-type channel of the other memory cells to prevent them from causing interference and being disturbed. The bit lines (BL1, BL3) which are not connected to the [memory cell to be read] 40 are only required to be floated (FL).

Figure 7:
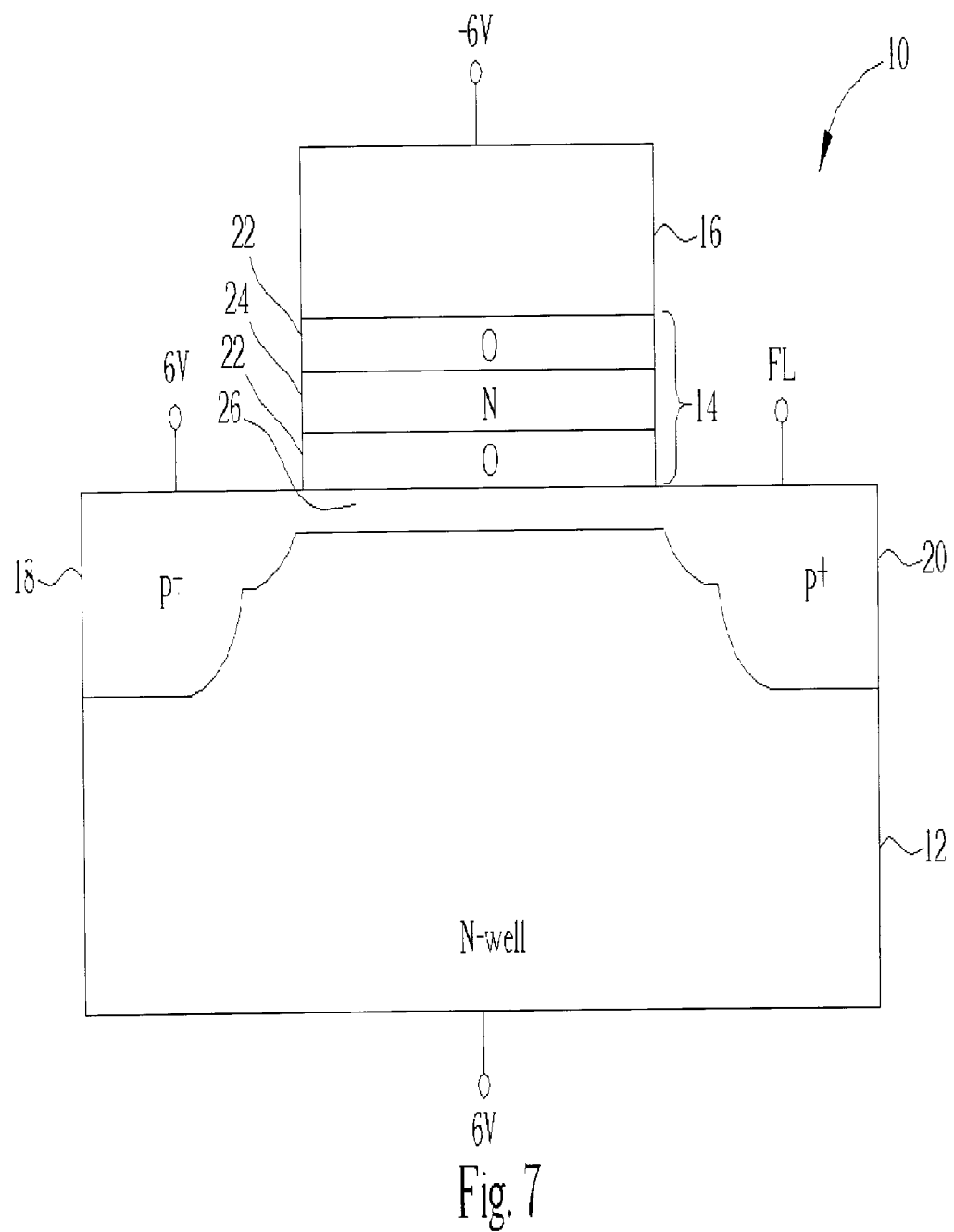
FIG. 7 illustrates the erase operation of the P-type memory cell according to the present invention.
Figure 8:
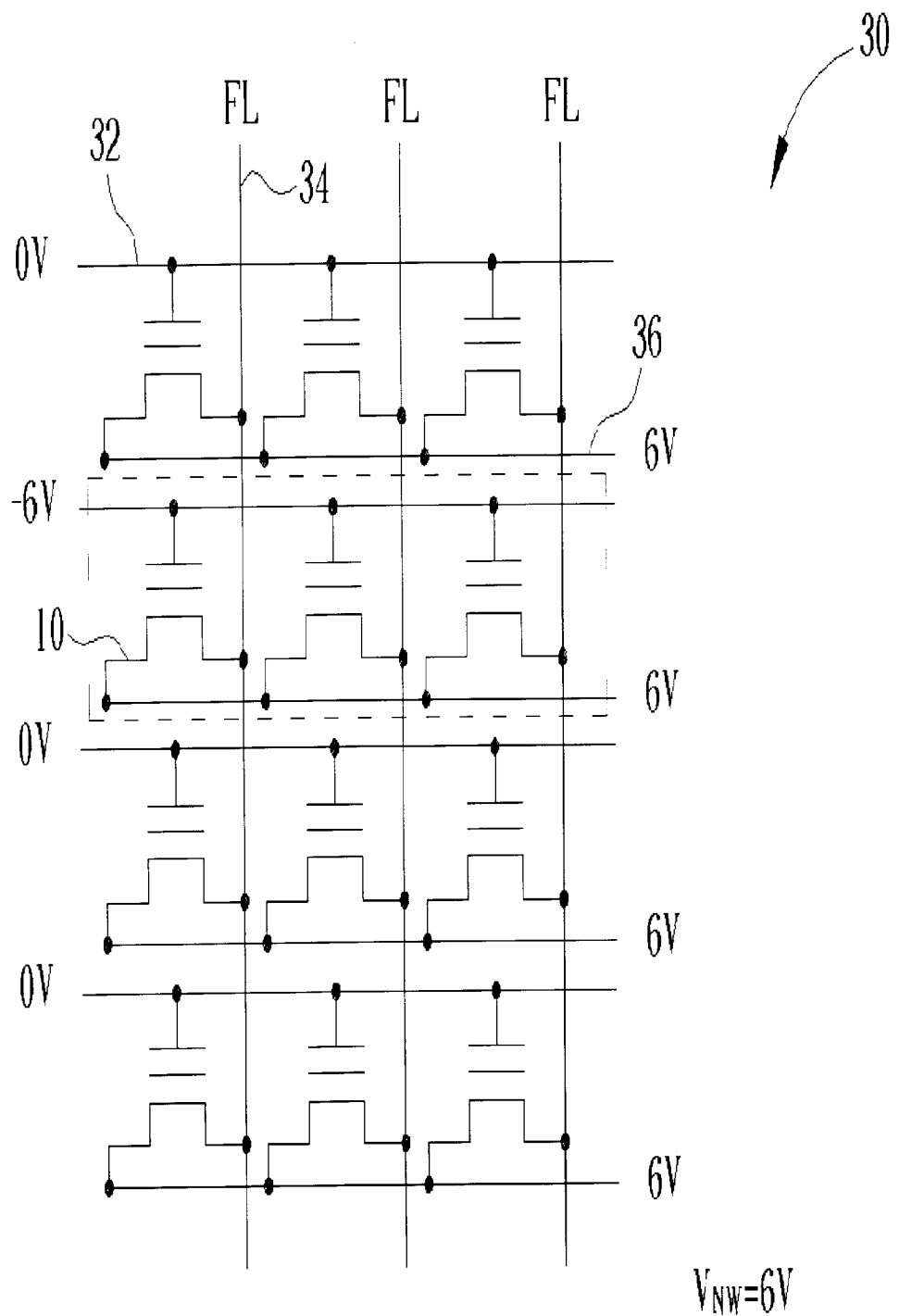
FIG. 8 illustrates the erase operation of the memory module according to the present invention.

Please refer to FIG. 7 showing the erase operation of the P-type memory cell 10, and to FIG. 8 showing the erase operation of the memory module 30; both of which are according to the present invention. The erase operation of the P-type memory cell 10 utilizes Fowler-Nordheim (FN) tunneling. As shown in FIG. 7, a voltage of −6V is applied to the gate 16 of the P-type memory cell 10, and a voltage of 6V is applied to the N-type well 12 and the source 18 of the P-type memory cell 10. Since the P-type channel 26 of the P-type memory cell 10 is turned on, the voltage of the drain 20 will be conducted to 6V so that it can be left floating. In this case, the cross voltage on the stack dielectric layer 14 is 12V so that the electrons in the charge storage layer 24 can be erased. As shown in FIG. 8, when erasing the memory cell 10 of the memory module 30, a voltage of 6V is applied to the source line 36 (SL), and a voltage of 6V is applied to the N-type well 12 and the word line 32 (BL2). The [memory cell to be erased] 10 can be selected by the word line 32.

Please refer to FIG. 9 showing a voltage list of the present invention. The list shows preferred voltages for the write, read, and erase operations of the P-type memory cell 10 and the memory module 30 of FIG. 2 to FIG. 8. The indicators are the same as those used in FIG. 1 and FIG. 2. However, the voltage parameters listed in FIG. 9 are only for reference and do not limit the range of the present invention. Moreover, all the operational voltages, including the N-type well voltage, the gate voltage, the source voltage, the drain voltage, the source line voltage, the word line voltage, and the bit line voltage can shift to an appropriate value to become positive voltages.

As mentioned above, the NOR-array memory module includes a plurality of P-type memory cells, and each P-type memory cell includes a stack dielectric layer to store 2-bit data so that the capacity and the density of the memory module are increased. The operating methods of the NOR-array memory include a write operation using channel hot hole induced hot electron injection, a read operation using reverse reading, and an erase operation using FN tunneling. In consideration of the NOR-array composed of the P-type memory cells, channel hot hole induced hot electron injection can reduce the operating voltage while maintaining the writing efficiency of a memory cell. Moreover, since the memory module can operate with low voltages, it can be manufactured by a typical logic process instead of a special process so that the memory module can be integrated in any logic chip. Additionally, the stack dielectric layer can be manufactured by utilizing an extra mask in a typical logic process.

In contrast to the prior art, the operating method of the NOR-array composed of P-type memory cells according to the present invention has advantages of high density, high capacity, high stability, low voltage operation, and low power consumption. Additionally, it can be manufactured using a typical logic process and can be more widely used than the conventional memory module composed of N-type memory cells.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for writing a memory module comprising:
providing a plurality of memory cells, wherein each memory cell stores 2-bit data and comprises a substrate, a P-type drain, a P-type source, a stack dielectric layer, and a gate, and the plurality of memory cells are arranged in a matrix with the gates of the memory cells on the same row being connected to the same word line, the drains of the memory cells on the same column being connected to the same bit line, and the sources of the plurality of memory cells on the same row being connected to the same source line;
applying a source line voltage to the source lines of the plurality of memory cells;
applying a first word line voltage to the word line of the memory cell to be written in order to turn on a P-type channel of the memory cell to be written;
applying a second word line voltage to the word line of the memory cell not to be written in order to turn off the P-type channel of the memory cell;
applying a bit line voltage to the bit line of the memory cell to be written so that a hot hole in the P-type channel of the memory cell to be written induces hot electrons to be injected into the stack dielectric layer of the memory cell to be written; and
applying a substrate voltage to the substrate of the plurality of memory cells.

2. The method of claim 1 wherein the source line voltage is larger than the bit line voltage so that the hot hole in the P-type channel of the memory cell to be written induces the hot electrons to be injected into the stack dielectric layer of the memory cell to be written at a place adjacent to the P-type drain to generate first bit data.

3. The method of claim 1 wherein the source line voltage is less than the bit line voltage so that the hot hole in the P-type channel of the memory cell to be written induces the hot electrons to be injected into the stack dielectric layer of the memory cell to be written at a place adjacent to the P-type drain to generate second bit data.

4. The method of claim 1 wherein the matrix is a NOR-array.

5. The method of claim 1 wherein the stack dielectric layer is composed of a silicon dioxide layer, a charge storage layer, and another silicon dioxide layer.

6. The method of claim 5 wherein the charge storage layer is composed of silicon nitride ($Si_3N_4$).

7. The method of claim 5 wherein the charge storage layer is composed of silicon oxy-nitride ($Si_xN_yO_z$).

8. A method for reading a memory module comprising:
providing a plurality of memory cells, wherein each memory cell stores 2-bit data and comprises a substrate, a P-type drain, a P-type source, a stack dielectric layer, and a gate, and the plurality of memory cells are arranged in a matrix with the gates of the memory cells on the same row being connected to the same word line, the drains of the memory cells on the same column being connected to the same bit line, and the sources of the plurality of memory cells on the same row being connected to the same source line;
applying a source line voltage to the source lines of the plurality of memory cells;
applying a first word line voltage to the word line of the memory cell to be read;

applying a second word line voltage larger than the first word line voltage to the word line of the memory cell not to be read;

applying a voltage equivalent to the first word line voltage to the substrates of the plurality of memory cells; and applying a bit line voltage to the bit line connected to the memory cell to be read in order to enlarge a depletion region between the P-type drain or the P-type source and the substrate of the memory cell to be read.

9. The method of claim 8 wherein the source line voltage is less than the bit line voltage in order to enlarge the depletion region between the P-type source and the substrate of the memory cell to be read.

10. The method of claim 8 wherein the source line voltage is larger than the bit line voltage in order to enlarge the depletion region between the P-type source and the substrate of the memory cell to be read.

11. The method of claim 8 wherein the matrix is a NOR-array.

12. The method of claim 8 wherein the stack dielectric layer is composed of a silicon dioxide layer, a charge storage layer, and another silicon dioxide layer.

13. The method of claim 12 wherein the charge storage layer is composed of silicon nitride ($Si_3N_4$).

14. The method of claim 12 wherein the charge storage layer is composed of silicon oxy-nitride ($Si_xN_yO_z$).

15. A method for erasing a memory module comprising:

providing a plurality of memory cells, wherein each memory cell stores 2-bit data and comprises a substrate, a P-type drain, a P-type source, a stack dielectric layer, and a gate, and the plurality of memory cells are arranged in matrix with the gates of the memory cells on the same row being connected to the same word line, the drains of the memory cells on the same column being connected to the same bit line, and the sources of the plurality of memory cells on the same row being connected to the same source line;

applying a word line voltage to the word lines of the plurality of memory cells;

applying a source line voltage larger than the word line voltage to the source lines of the plurality of memory cells; and applying a voltage equivalent to the source line voltage to the substrates of the plurality of memory cells.

16. The method of claim 15 wherein the matrix is a NOR-array.

17. The method of claim 15 utilizing Fowler-Nordheim tunneling to erase the electrons limited in the gate.

18. The method of claim 15 wherein the stack dielectric layer is composed of a silicon dioxide layer, a charge storage layer, and another silicon dioxide layer.

19. The method of claim 18 wherein the charge storage layer is composed of silicon nitride ($Si_3N_4$).

20. The method of claim 18 wherein the charge storage layer is composed of silicon oxy-nitride ($Si_xN_yO_z$).

* * * * *